United States Patent [19]

Shinkle

[11] Patent Number: 5,250,925
[45] Date of Patent: Oct. 5, 1993

[54] PACKAGE FOR SPEED SENSING DEVICE HAVING MINIMUM AIR GAP

[75] Inventor: George A. Shinkle, Luxembourg, Luxembourg

[73] Assignee: General Motors Corporation, Detroit, Mich.

[21] Appl. No.: 881,114

[22] Filed: May 11, 1992

[51] Int. Cl.$^5$ .................................. H01L 43/00
[52] U.S. Cl. .................... 338/32 R; 324/207.21; 338/32 H; 174/52.1
[58] Field of Search .................. 338/32 R, 32 H; 324/207.21; 174/52.1, 52.2, 52.3

[56] References Cited

U.S. PATENT DOCUMENTS

| | | | |
|---|---|---|---|
| 4,227,171 | 10/1980 | Masuda et al. | 338/33 |
| 4,398,342 | 8/1983 | Pitt et al. | 29/580 |
| 4,401,966 | 8/1983 | Ohmura et al. | 338/32 R |
| 4,584,552 | 4/1986 | Suzuki et al. | 338/32 H |
| 4,922,197 | 5/1990 | Juds et al. | 338/32 R |

*Primary Examiner*—Marvin M. Lateef
*Attorney, Agent, or Firm*—Robert J. Wallace; Domenica N. S. Hartman

[57] ABSTRACT

A magnetic field sensing device in the form of a sensor unit which reduces the effective air gap between the sensing device and its exciter is provided by packaging the sensing device in the manner that provides protection from the environment while simultaneously minimizing the distance between the sensing device and its exterior surface adjacent its exciter. The present invention is particularly suitable for automotive applications, such as magnetic field sensing devices for detecting the wheel speed for an electronic anti-lock braking system.

22 Claims, 2 Drawing Sheets

PACKAGE FOR SPEED SENSING DEVICE HAVING MINIMUM AIR GAP

The present invention generally relates to magnetic field sensitive devices, such as magnetoresistors and Hall effect sensing devices, and the packaging therefor. More particularly, this invention relates to improved sensors of this type, wherein the improvement is attributable to the sensor's packaging which significantly reduces the minimum obtainable distance between the sensing device and an object being sensed.

BACKGROUND OF THE INVENTION

Sensing devices which can detect the presence of a object in the vicinity of the device have been widely used under test and manufacturing conditions for monitoring test hardware and manufacturing equipment. Such sensing devices typically utilize a magnetic field and employ sensing equipment that detect changes in the strength of a magnetic field. Magnetic field strength is defined as the magnetomotive force developed by a permanent magnet per the distance in the magnetization direction.

As an example, an increase in the strength of a magnetic field, corresponding to a drop in the reluctance of a magnetic circuit, will occur as an object made from a high magnetic permeability material, such as iron, is moved toward the magnet. Magnetic permeability is the ease with which the magnetic lines of force, designated as magnetic flux, can pass through a substance magnetized with a given magnetizing force. Quantitatively, it is expressed as the ratio between the magnetic flux density (the number of lines of magnetic flux per unit area which are perpendicular to the direction of the flux) produced and the magnetic field strength, or magnetizing force.

Because the output signal of a magnetic field sensing device is dependent upon the strength of the magnetic field, it is effective in detecting the distance between the sensing device and an object within the magnetic circuit. The range within which the object can be detected is limited by the flux density, as measured in gauss or teslas.

Where it is desired to determine the speed or rotational position of a rotating object, such as a disk mounted on a shaft, the object is typically provided with surface features that project toward the sensing device, such as teeth. The proximity of a tooth to the sensing device will increase the strength of the magnetic field. Accordingly, by monitoring the output of the sensing device, the rotational speed of the disk can be determined by correlating the peaks in the sensor's output with the known number of teeth on the circumference of the disk. Likewise, where the teeth are irregularly spaced in a predetermined pattern, the rotational position of the body can be determined by correlating the peak intervals with the known intervals between the teeth on the disk.

Two prominent forms of such sensing devices are the magnetoresistor and the Hall effect sensor. A magnetoresistor is a device whose resistance varies with the strength of the magnetic field applied to the device. Generally, the magnetoresistor is a slab of electrically conductive material, such as a metal or a semiconductor. For many automotive applications, the preferred form of a magnetoresistor is a thin elongate body of a high carrier mobility semiconductor material, such as indium antimonide (InSb) or indium arsenide (InAs), having contacts at its ends. The magnetoresistor is mounted within and perpendicular to a magnetic circuit which includes a permanent magnet and an exciter. The exciter is a high magnetic permeability element having projecting surface features which increase the strength of the magnet's magnetic field as the distance between the surface of the exciter and the permanent magnet is reduced. Typically, the exciter will be in the form of a series of spaced teeth separated by slots, such as the teeth on a gear. The exciter moves relative to the stationary magnetoresistor element, and in doing so, changes the reluctance of the magnetic circuit so as to cause the magnetic flux through the magnetoresistor element to vary in a manner corresponding to the position of the teeth. With the change in magnet flux there occurs the corresponding change in magnet field strength, which increases the resistance of the magnetoresistor.

A Hall effect sensor is similar in construction to a magnetoresistor, but relies upon a transverse current flow that occurs in the presence of a magnetic field. The Hall effect sensor is primarily driven by a direct current voltage source having electrodes at both ends of the Hall effect sensor, creating a longitudinal current flow through the sensor's body. In the presence of a magnetic field, a transverse current is induced in the sensor, which can be detected by a second pair of electrodes transverse to the first pair. The second pair of electrodes can then be connected to a voltmeter to determine the potential created across the surface of the sensor. Similar to the resistance of a magnetoresistor, this transverse current flow also increases with a corresponding increase in the magnetic field's strength.

With the increasing sophistication of products, magnetic field sensing devices have also become common in products that rely on electronics in their operation, such as automobile control systems. Common examples of automotive applications are the detection of ignition timing from the engine crankshaft and/or camshaft, and the detection of wheel speed for anti-lock braking systems and four wheel steering systems. For detecting wheel speed, the exciter is typically a exciter wheel mounted inboard from the vehicle's wheel, the exciter wheel being mechanically connected to the wheel so as to rotate with the wheel. The exciter wheel is provided with a number of teeth which typically extend axially from the perimeter of the exciter wheel to an inboard-mounted magnetic field sensor. As noted before, the exciter wheel is formed of a high magnetic permeability material, such as iron, such that as each tooth rotates toward the sensor device, the strength of the magnetic field increases as a result of a decrease in the magnetic circuit's reluctance. Subsequently, the magnetic circuit reluctance increases and the strength of the magnetic field decreases as the tooth moves away from the sensing device. In the situation where a magnetoresistor is used, the output will be seen as a drop in current through the magnetoresistor as each tooth passes near the magnetoresistor. Where a Hall effect device is used, there will be a corresponding peak in the device's potential across the transverse electrodes as each tooth passes near the device.

A common shortcoming of magnetic field sensing devices is their output's dependence upon the distance between the exciter and the sensing device, known as the air gap. More specifically, as the air gap increases, the maximum output range of the device decreases, decreasing the resolution of the output and making it more difficult to accurately analyze the device's output. The output of a magnetoresistor is particularly susceptible to the detrimental effects of a large air gap in relatively low strength magnetic fields, such as magnetic fields found in typical automotive applications (approximately 500 to 2000 gauss) in that the resistance of the magnetoresistor is dependent upon the square of the magnetic field's strength. Specifically, the resistance of a magnetoresistor under the influence of a magnetic field is:

$$R_b = R_o(1 + g\mu^2 B^2)$$

where $R_b$ is the resistance of the device under the influence of the magnetic field, $R_o$ is the resistance of the device free from the influence of the magnetic field, g is a geometric factor, $\mu$ is the mobility of the electrons or holes in the device (a characteristic of the material of the device), and B is the strength of the magnetic field. In contrast, the output of a Hall effect device is directly proportional to the strength of the magnetic field, and therefore is not as sensitive to the air gap at low strength magnetic fields as is a magnetoresistor.

Conventionally, the air gap is defined as the distance between the exciter and the outer surface of the package containing the sensing device. An "effective air gap" may be described as the distance between the exciter and the sensing device itself. As can be seen in FIG. 1, the prior art magnetic field sensors 100 typically include a housing 112 which encloses a permanent magnet 116 and sensing device 110. However, this type of packaging is unsuited for harsh environments, particularly that of an automobile. As a result, such sensing devices are further enclosed in an additional housing (not shown) which affords protection from moisture and dirt. Accordingly, while the sensing device's air gap—the distance between the exciter and the sensing device's package—may be unchanged, the sensing device's effective air gap—the distance between the exciter and the sensing device itself—may be increased significantly. Thus, while improving the life of the sensing device, a particularly significant shortcoming to this approach is the decrease in the peak magnetic field strength as a tooth passes in proximity to the sensing device due the larger effective air gap.

Thus, it would be desirable to provide a packaging scheme for a magnetic field sensing device, such as magnetoresistors and Hall effect devices, that would provide reliable protection from the environment while also avoiding an excessive increase in the effective air gap between the sensing device and the exciter.

SUMMARY OF THE INVENTION

It is an object of this invention to provide a sensing device whose packaging imposes minimal interference with the sensing device's ability to sense its target.

It is a further object of this invention that such a sensing device be a magnetic field sensing device which employs a permanent magnet whose magnetic field strength increases when a high magnetic permeability material is in the vicinity of the sensing device.

It is yet another object of this invention that the packaging for such a sensing device include means for isolating the sensing device from the environment.

Lastly, it is still a further object of this invention that the packaging for such a sensing device exhibit minimal degradation of the magnetic field strength by enabling the effective air gap between the sensing device and its target to be kept to a minimum.

In accordance with a preferred embodiment of this invention, these and other objects and advantages are accomplished as follows.

According to the present invention, there is provided a magnetic field sensing device which is packaged to be sufficiently environmentally rugged for automotive use. The packaging for the sensing device is formed to be integral with the sensing device, such that further packaging is not required for permanent installation of the sensing device. Accordingly, the sensing device can be mounted as an integral sensing unit into a appropriate opening in a body that contains a permanent magnet. The packaging of the sensing device also serves to enclose the permanent magnet, while the sensing device remains at least partially exposed to the environment for maximal positioning relative to an exciter.

The sensing unit is integrally formed as a sensing device within a housing sized to be at least partially received in the receptacle of the body. The housing has an exterior surface and a peripheral surface, the exterior surface being the surface of the sensing unit which faces the target, or exciter, of the sensing device. The sensing device is mounted to the housing directly beneath the exterior surface, with a sufficient thickness of the housing being provided between the sensing device and the exterior surface to provide protection from the environment. The housing's peripheral surface forms a sealed barrier between the housing and the body so as to create a sealed enclosure for the sensing device which excludes moisture and dirt.

The packaging approach of this invention improves the sensitivity of the sensing device to changes in the strength of the permanent magnet's magnetic field by minimizing the effective air gap between the sensing device and the exciter. With this improvement in sensitivity, the overall performance of the magnetic field sensing device is enhanced.

The packaging approach of the present invention also provides sufficient support to the sensing device so as to be suitably rugged to withstand vibration, while also resisting vibration which would otherwise dislodge the sensing unit from the opening in which it resides. Moreover, the sensing unit includes molded-in electrical leads for the sensing device such that installation of the sensing device into the receptacle can be done quickly and reliably under manufacturing conditions.

Using this packaging method, the magnetic circuit formed by the permanent magnet and the exciter is improved by decreasing the reluctance between the two. With the corresponding increase in the magnetic field's strength, the sensing device's output is enhanced due to its dependency on the magnetic field strength, particularly where the sensing device is a magnetoresistor.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein.

DETAILED DESCRIPTION OF THE INVENTION

In accordance with the present invention, a sensor unit 10 which reduces the effective air gap between a sensing device and its target is provided by packaging the sensing device in the manner that provides protection from the environment while simultaneously minimizing the distance between the sensing device and its exterior surface adjacent its target.

Figure 1:
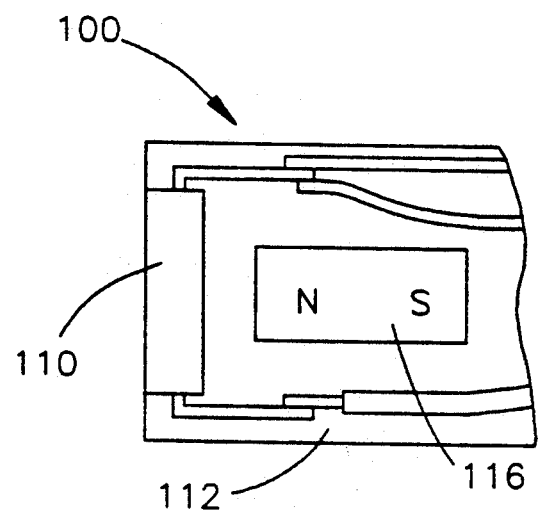
FIG. 1 is a cross-section of a magnetic field sensing device of the prior art.
Figure 2:
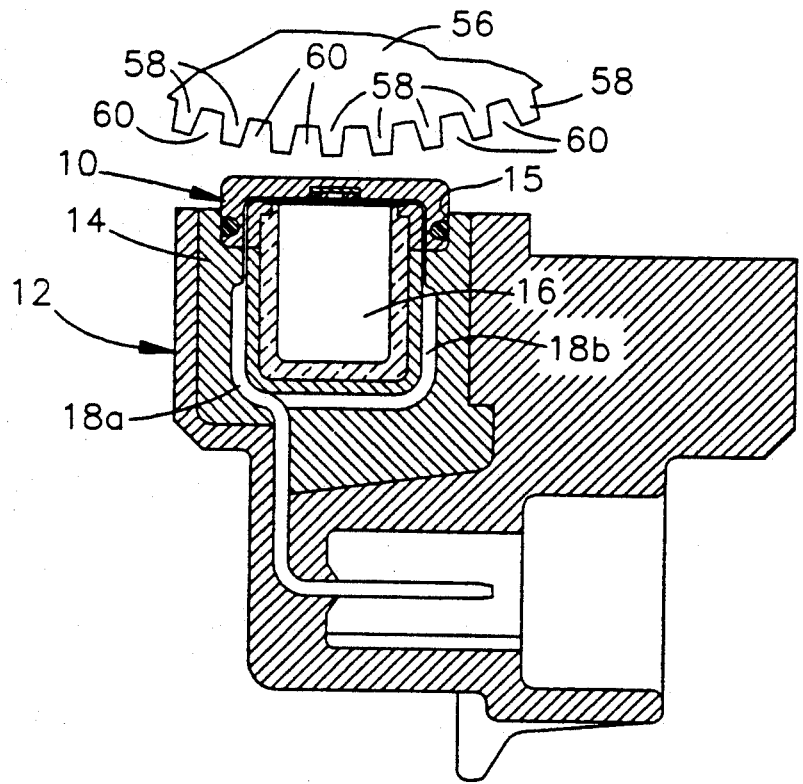
FIG. 2 is a cross-section of a body in which a magnetic field sensing device of the present invention is housed in accordance with a first embodiment of this invention.
Figure 3:
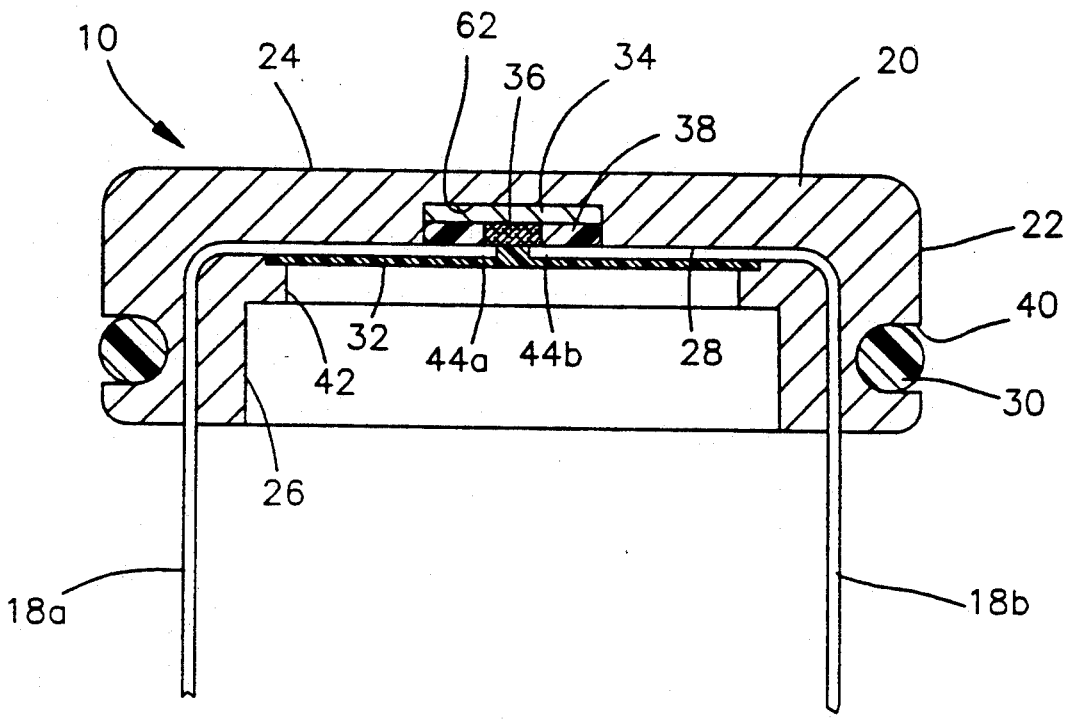
FIG. 3 is a detailed cross-sectional view of as sensing unit containing the magnetic field sensing device of FIG. 2 in accordance with the first embodiment of this present invention.
Figure 4:
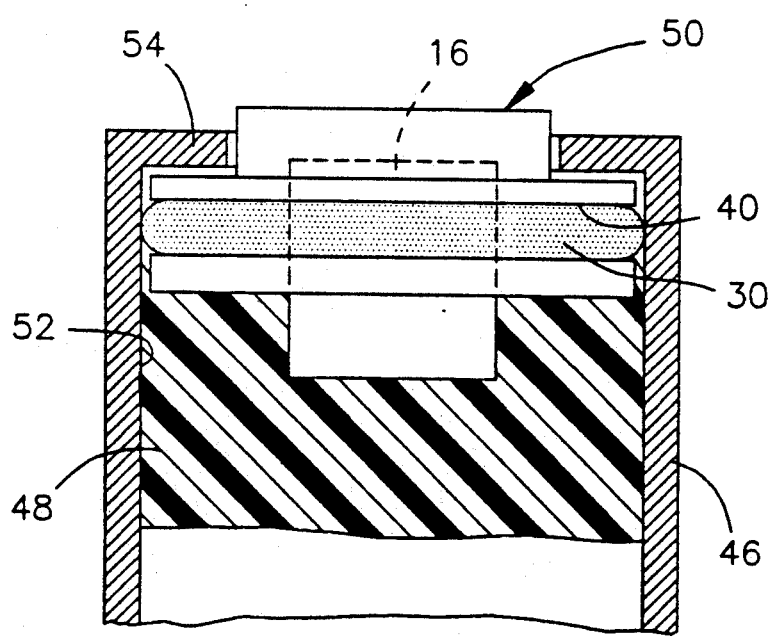
FIG. 4 is a cross-sectional view of a sensing unit containing magnetic field sensing device in accordance with a second embodiment of this present invention.

The present invention is particularly suitable for automotive applications, such as magnetic field sensing devices for detecting the wheel speed for an electronic anti-lock braking system. For descriptive purposes, the sensing device illustrated in FIG. 2 through 4 is depicted as a magnetoresistor 34 that, in combination with a permanent magnet 16, is used to detect the rotational speed of a toothed exciter wheel 56 for an automotive anti-lock braking system (not shown). The exciter wheel 56 is rotatably mounted in the wheel housing of a vehicle equipped with an anti-lock braking system. The exciter wheel 56 is engaged for rotation with one of the automobile's wheels, the rotational speed of which is required for feedback to the anti-lock circuitry to prevent complete lockup of the wheel during braking.

Referring specifically to FIG. 2, the sensor unit 10 is mounted within a housing 12 which is mounted adjacent the exciter wheel 56 for the purpose of locating the sensor unit 10 near the exciter wheel 56. The housing 12 can be of any suitable shape and construction, and may be adapted for various additional purposes, such as housing other sensing devices.

The housing 12 is located radially from the exciter wheel 56 so as to position the sensing unit 10 a predetermined distance from a series of teeth 58 formed on the exciter wheel's perimeter. This distance is termed the air gap, which is of primary interest for purposes of the present invention. Generally, the air gap will be dependent upon the particular application and the result of the tolerances of the hardware used. Air gaps of 0.5 to 2.0 millimeters are not unusual, such as with the embodiment illustrated in FIG. 2.

Between each tooth 58 is a slot 60 which clearly delineates adjacent teeth 58. Generally, the teeth 58 are evenly spaced by the slots 60 around the periphery or circumference of the exciter wheel 56 and are substantially identical in size and shape. The housing 12 is fixed in a stationary position adjacent the teeth 58 of the exciter wheel 56 so that the teeth 58 and slots 60 alternately pass the sensor unit 10 as the wheel of the automobile rotates.

In the preferred embodiment, the housing 12 is provided in the form of an overmold and includes a transfer mold 14 formed from non-magnetic material, such as a suitable structural plastic. The transfer mold 14 forms a opening 15 into which the sensor unit 10 can be readily mounted. As will be explained more fully below, the use of the transfer mold 14 in conjunction with an overmold housing 12 enables the contraction of the housing 12 about the transfer mold 14 to positively retain the transfer mold 14 while also providing an effective barrier to moisture and dirt.

The opening is also sized to receive the permanent magnet 16. The permanent magnet 16 has oppositely disposed north and south poles, and may be formed from such high magnetic energy product materials as rare earth neodymium or samarium cobalt, as well as others. The permanent magnet 16 is shown as being cylindrical in shape, although this shape is not necessary. Together, the exciter wheel 56 and the permanent magnet 16 define a magnetic circuit. The permanent magnet 16 is oriented with its poles aligned with the exciter wheel 56, and the magnetoresistor 34 is positioned within the sensor unit 10 so that the resulting magnetic field is perpendicular to the magnetoresistor 34. With this spacial relationship between the components of the magnetic circuit, the presence of a tooth 58 of the exciter wheel 58 adjacent the sensor unit 10 causes an increase in the magnetic flux of the magnetic circuit, which lowers the circuit's reluctance and thus effects the magnetoresistor's output as the exciter wheel 56 rotates.

As best seen in FIG. 3, the sensor unit 10 is a generally disk-shaped package 20, having a planar upper surface 24, a lower interior surface 28, and a peripheral surface 22. The package 20 can be of any suitable nonmagnetic material, such as a plastic of the thermoset type. Referring back to FIG. 2, it can be seen that the upper surface 24 serves as the exterior surface for the sensor unit 10, while the peripheral surface 22 closely fits within the opening 15 formed in the housing 12. It is this exterior surface 24 that defines the air gap between the sensor unit 10 and the exciter wheel 56.

Disposed on the peripheral surface 22 is an O-ring groove 40 which is sized to receive an O-ring 30. The O-ring 30 can be formed from any suitably resilient and weather-resistant material that can withstand relatively high temperatures, such as is found in some automotive environment, i.e. about 200° C. A typical example of such a material is ethylene propylene. Referring to FIG. 2, it can be seen that the O-ring 30 serves two functions. First, the O-ring 30 serves to protect and isolate the opening 15, permanent magnet 16 and the magnetoresistor 34 from the environment, which includes moisture, corrosives, dust and dirt. Secondly, the O-ring 30 also serves to frictionally retain the sensor unit 10 and the permanent magnet 16 within the opening 15. However, the benefits of the O-ring 30 may also be achieved without the use of an O-ring. By providing a close fit between the overmold housing 12, the transfer mold 14 and the peripheral surface 22, the transfer mold 14 can be formed with suitably thin walls such that the housing 12 sufficiently collapses the transfer mold 14 about the peripheral surface 22 to form a sealable barrier.

The package 20 contains the magnetic field sensing device, which, as noted above, will be described in terms of the magnetoresistor 34. However, the principles of the present invention are also applicable to other magnet field sensing devices, such as Hall effect sensors. As also noted previously, the magnetoresistor 34 is mounted within and perpendicular to a magnetic circuit created by the permanent magnet 16 and the exciter wheel 56. The magnetoresistor 34 is preferably an elongate thin strip of a high carrier mobility semiconductor material, such as indium antimonide (InSb) or indium arsenide (InAs). The magnetoresistor 34 has an oppositely disposed pair of electrodes formed by a pair of electrically conductive pads 38. The pads 38 are preferably formed from an electrically conductive epoxy.

Both the magnetoresistor 34 and the pads 38 are recessed into the interior surface 28 of the package 20 so as to be closely spaced from the exterior surface 24 of the package 20. Within the recess 62, the magnetoresistor 34 can be located as little as 0.2 millimeters from the exterior surface 24 of the package 20 while sustaining sufficient structural strength to withstand the rigors of its automotive application. Consequently, the effective air gap—the distance between the magnetoresistor 34 and the exciter wheel 56—is a combination of the air gap between the sensor unit 10 and the exciter wheel 56 and the thickness of the package between the magnetoresistor 34 and the exterior surface 24. In practice, by eliminating the need for an additional housing to enclose and protect the magnetoresistor 34, an effective air gap of 0.5 to 1.0 millimeters has been reduced by 0.2 to 0.7 millimeters with the embodiment illustrated in FIG. 2.

Disposed along the interior surface 28 of the package 20 are an oppositely extending pair of leads 18a and 18b. The leads 18a and 18b are molded into the package 20 to be permanent components of the sensor unit 10. Opposing ends 44a and 44b of the leads 18a and 18b each contact a corresponding one of the two pads 38 to provide an electrically conductive path through the magnetoresistor 34. Finally, to positively retain the magnetoresistor 34, the pads 38 and the leads 18a and 18b, a retaining member 32 is disposed against the interior surface 28 and the leads 18a and 18b, on the retaining member's upper surface, and against a shoulder 42 which extends radially from the interior wall 26 of the package 20. The retaining member 32 can be of any suitable form, such as a fiber-reinforced epoxy.

The improved operation of the sensor unit 10 is as follows. The arrangement of the permanent magnet 16 with the exciter wheel 56 sets up a magnetic circuit therebetween, creating a magnetic field with a predetermined magnetic flux whose density is dependent upon the upon the magnetic strength of the magnetic circuit. The magnetic flux of the magnetic circuit extends arcuately between the poles of the permanent magnet 16, one of which will be the south pole while the other is the north pole. The poles are oriented to be perpendicular to the magnetoresistor 34, such that one of the poles is disposed near the sensor unit 10 while the other pole is displaced from the magnetoresistor 34. A large percentage of the magnetic flux is contained within a loop which can be traced from the pole furthest from the magnetoresistor 34, across a large air gap between the this pole and the exciter wheel 56, and back through the smaller air gap to the pole nearest the magnetoresistor 34. The rotation of the exciter wheel 56 produces cyclical fluctuation in the reluctance of the magnetic circuit, which thereby causes a corresponding fluctuation in the strength of the magnetic field to which the magnetoresistor 34 is exposed. The resistance of the magnetoresistor 34 increases with an increase in the strength of the magnetic field corresponding to a tooth 58 being in proximity to the magnetoresistor 34, and decreases with an decrease in the strength of the magnetic field corresponding to a gap 60 being in proximity to the magnetoresistor 34. When provided with a direct current through the leads 18a and 18b, the magnetoresistor 34 produces an analog output having a peak at each interval where a gap 60 is adjacent the exterior surface 24 of the sensor unit 10. Accordingly, knowing the number of teeth 58 in the exciter wheel 56 enables the magnetoresistor's output to be used to determine the speed at which the wheel is rotating. In the preferred embodiment, the reduction in the effective air gap between the magnetoresistor 34 and the exciter wheel 56 has improved performance by approximately 5 to 50% in terms of the magnetoresistor's output signal. The particular improvement in performance will vary depending upon the specific application.

FIG. 4 illustrates an alternative embodiment of a sensor unit 50 which also provides a durable sensor package while enabling the effective air gap to be reduced between the magnetoresistor 34 and the exciter wheel 56. The second embodiment differs structurally from the first embodiment described above, but provides the same operational improvements. Contrary to the first embodiment, the sensor unit 50 is permanently fixed in a housing 46.

The sensor unit 50 is installed through a bore 52 in the housing 46 from an interior side of the housing 46. The sensor unit 50 is permitted to project from the exterior side of the housing 46 (facing the exciter wheel 56) through a radial shoulder 54. Thus, the sensor unit 50 cannot be removed from the housing 46 through the radial shoulder 54, and is therefore not serviceable without first disassembling the housing 46. Furthermore, the sensing unit 50 is positively held against the radial shoulder 54 within the housing 46 by a suitable quantity of a potting material 48, such as a plastic of the thermoset or thermoplastic type.

As with the first embodiment, the sensor unit 50 is fixed in a stationary position adjacent the teeth 58 of the exciter wheel 56 so that the teeth 58 and slots 60 of the exciter wheel 56 alternately pass the sensor unit 50 as the exciter wheel 56 rotates. Also similar to the first embodiment, the magnetoresistor 34 (not shown) is disposed within a recess below the exterior surface of the sensor unit 50 so as to minimize the effective air gap between the magnetoresistor 34 and the exciter wheel 56.

Accordingly, a significant advantage to both sensor units 10 and 50 of the first and second embodiments, respectively, of the present invention is that the effective air gap between the magnetic field sensing device and its exciter is minimized to improve the resolution of the sensing device's output. Accordingly, low strength magnetic fields can be utilized in automotive applications while maintaining a sufficient signal that can be detected and analyzed by the control circuitry which the sensing device serves.

Another significant advantage of the present invention is that the sensor units 10 and 50 are sufficiently rugged and durable to be exposed to the environment so as to be suitable for use in automotive applications. The sensor units 10 and 50 each provide an fully integrated packaging for a sensing device. As a result, an additional housing is not needed to enclose the sensor units 10 and 50 to protect the sensing device from moisture, grime and corrosives. Consequently, total packaging costs are also significantly reduced.

Therefore, while our invention has been described in terms of a preferred embodiment, it is apparent that other forms could be adopted by one skilled in the art, for example by modifying the exterior shape of the package 20, or by substituting appropriate magnetic materials, or by basing the operation of the sensing device on other related technologies, such as eddy-current sensing devices. Accordingly, the scope of our invention is to be limited only by the following claims.

The embodiments of the invention in which an exclusive property or privilege is claimed are defined as follows:

1. A rugged magnetic sensor assembly which includes a housing having an opening for receiving a magnetic sensing unit, said sensor assembly comprising:
   a prepackaged magnetic sensing unit which is not sufficiently rugged to be used in a given application, said sensing unit having first and second external surface areas and comprised of an encapsulated sensing device having electrical leads, wherein the encapsulation is not adequately protective of the electrical lead areas of said prepackaged sensing unit, said first external surface being a sealing surface and said second external surface being proximate said sensing device;
   a housing having an opening therein adapted to cooperatively receive said sensing unit;
   said sensing unit of size and shape complementary to said housing opening, effective to be at least partially received in said opening of said housing;
   said sensor unit at least partially disposed within said opening and having said first exterior surface cooperatively disposed with respect to an interior surface of said housing, which interior surface defines said opening in said housing, and leaving said second exterior surface exposed outside said housing; and
   means for sealing said exterior surface on said sensing unit against said interior surface of said housing;
   wherein said sealing means, external surface of said sensing unit, and said interior surface of said housing define an enclosure for retaining said sensing unit in fixed position and for protecting said electrical lead areas of said sensing unit from deleterious environmental effects of said given application, and wherein portions of said housing do not overlie said second surface portion of said sensing unit and thereby substantially decrease magnetic sensitivity of said sensing unit.

2. A as recited in claim 1 wherein said pre-packaged sensing unit is disc-shaped and has opposed surfaces separated by a perimetric surface, said first external surface is on or adjacent said perimetric surface, and said second external surface is one of said opposed surfaces.

3. A sensor assembly as recited in claim 2 wherein said sealing means comprises:
   a substantially continuous groove formed in said peripheral surface of said sensing unit that is generally parallel to said opposed surfaces and that surrounds said sensing unit; and
   an O-ring disposed in said groove.

4. A sensor assembly as recited in claim 1 further comprising means for concurrently retaining said sensing unit in said opening of said housing and sealing interfacial areas of said external and interior surfaces; and
   said housing member comprising at least a premolded inner member having said opening for receiving said sensing unit, and an over-molded outer member.

5. A sensor assembly as recited in claim 4 wherein said retention means comprises:
   an encircling groove formed in said first external surface of said sensing unit; and
   an o-ring disposed in said groove.

6. A magnetic sensor assembly which includes a housing having a pre-molded inner member, an overmolded outer member, and said inner member having an opening for receiving a pre-packaged magnetic sensor unit, said sensor assembly comprising:
   a prepackaged magnetic sensing unit having first and second external surface areas and comprised of an encapsulated sensing device having electrical lead areas that are to be isolated from an environment to which said encapsulation is to be exposed, said first external surface being a sealing surface and said second external surface being proximate said sensing device;
   a first housing member having an opening therein adapted to cooperatively receive said sensing unit, including electrical leads of said sensing unit, and containing electrical connector means;
   said sensing unit of size and shape complementary to said housing opening, effective to be at least partially received in said opening of said housing;
   said sensing unit at least partially disposed within said opening and having said first exterior surface cooperatively disposed with respect to an interior surface of said housing, which interior surface defines said opening in said housing, and leaving said second exterior surface exposed outside said housing;
   said sensing unit electrical leads protectively disposed within said first housing member and connected to said electrical connector means of said first housing member;
   a second housing member overmolded around said first housing member but not said second external surface of said sensing device; and
   means for sealing said exterior surface on said sensing unit against said interior surface of said housing;
   wherein said sealing means, and said first and second housing members provide an assembly for retaining said sensing unit in fixed position and for protecting said electrical lead areas of said sensing unit from deleterious environmental effects of said given application without substantially decreasing magnetic sensitivity of said sensing unit.

7. A sensing device as recited in claim 6, wherein said sensing unit has a circular disc-shaped encapsulation such that said first external surface on said sensing unit is defined by the perimeter of said disc-shaped encapsulation, and said second exterior surface is one axial end surface of said disc-shaped encapsulation, and said cavity is formed in an second axial and surface of said disc-shaped housing opposite said exterior surface.

8. A sensor assembly as recited in claim 7 wherein said retention means comprises a radial shoulder formed on the interior surface of said housing defining said opening.

9. A sensor assembly as recited in claim 8 wherein said sealing means comprises:
   a circumferential groove formed in a radial surface of said encapsulation which spaces said axial end surfaces of said encapsulation; and
   an o-ring disposed in said circumferential groove.

10. A sensor assembly as recited in claim 9 that further comprises:
    a circumferential-like groove formed in said first external surface of said sensing unit; and an o-ring disposed in said groove, acting to seal an interface between said sensing unit and said housing opening, and to retain said sensing unit within said housing.

11. A sensor assembly as recited in claim 10 wherein said sensing unit comprises a magnetoresistor disposed within said encapsulation.

12. A sensor assembly as recited in claim 11 wherein said magnetoresistor is disposed in said encapsulation so as to be substantially parallel to said second exterior surface.

13. A sensor assembly as recited in claim 12 wherein a permanent magnet is at least partially received within said opening in said first housing member, said permanent magnet being oriented such that its poles are perpendicular to said magnetoresistor for alignment with a target.

14. A sensor assembly as recited in claim 6 wherein said housing members include electrical contact means molded into and extending from said housing for external electrical connection to said sensing unit.

15. A sensor assembly as recited in claim 6 wherein said sensing unit comprises a permanent magnet at least partially received within said opening of said housing.

16. A sensor assembly for sensing a highly magnetically permeable target, said sensor assembly comprising a circular disk-like sensing unit disposed within a circular opening in a housing but still exposed outside of said housing, said sensor assembly comprising:

a sensing unit having electrical leads and a circular disc-shaped pre-molded encapsulation sized to be received in a circular opening in a housing member and at least partially contained in said housing member, said encapsulation having an exterior surface formed on a first axial end surface, a second axial end surface opposite said exterior surface, and a cylindrical radial surface spacing said axial end surfaces, said first axial end surface disposed in said housing for spacing from a high magnetic permeable target when said sensing unit is received within said housing opening;

a housing member having an opening therein sized to receive said sensing unit, including its electrical leads, electrical contact leads affixed within said housing and electrically connected to said electrical leads on said sensing unit, said housing electrical contact leads integrally formed with and extending from said housing;

a circumferential groove formed in said cylindrical radial surface of said housing; and resilient sealing means disposed in said groove for sealing between said sensing unit encapsulation and said opening of said housing, and for retaining said sensing unit in said opening of said housing;

wherein said sensing unit encapsulation is left partially exposed but which forms an enclosure with said housing for protecting electrical lead areas of said sensing unit.

17. A sensor assembly as recited in claim 16 wherein said opening in said housing comprises a reduced diameter portion formed spaced below an outer surface of said housing, effective to provide an annular shoulder in said housing interior, and said sensing means is disposed within said housing in abutment with said shoulder.

18. A sensor assembly as recited in claim 17 further comprising means for sealing said sensing unit in said housing.

19. A sensor assembly as recited in claim 16 wherein said sensing unit comprises a magnetoresistor disposed in said sensing unit encapsulation.

20. A sensor assembly as recited in claim 19 wherein said magnetoresistor is disposed in said encapsulation and said encapsulation is disposed in said housing to make said magnetoresistor be substantially parallel to said axial surfaces.

21. A sensor assembly as recited in claim 20 wherein a permanent magnet is at least partially received within said opening in said housing, said permanent magnet is oriented such that its poles are perpendicular to said magnetoresistor.

22. A sensor assembly as recited in claim 16 wherein said sensing unit comprises a permanent magnet at least partially received within said housing.

* * * * *